(12) United States Patent
Uchida

(10) Patent No.: US 11,457,530 B2
(45) Date of Patent: *Sep. 27, 2022

(54) PREPREG AND LAMINATE FOR CIRCUIT BOARD

(71) Applicant: KYOCERA Corporation, Kyoto (JP)

(72) Inventor: Kazumichi Uchida, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 56 days.

This patent is subject to a terminal disclaimer.

(21) Appl. No.: 17/003,057

(22) Filed: Aug. 26, 2020

(65) Prior Publication Data

US 2020/0389973 A1 Dec. 10, 2020

Related U.S. Application Data

(63) Continuation of application No. PCT/JP2018/046589, filed on Dec. 18, 2018.

(30) Foreign Application Priority Data

Feb. 27, 2018 (JP) .............................. JP2018-032996

(51) Int. Cl.
  *B32B 15/14* (2006.01)
  *H05K 1/03* (2006.01)

(52) U.S. Cl.
  CPC ............. *H05K 1/036* (2013.01); *B32B 15/14* (2013.01); *H05K 2201/0129* (2013.01)

(58) Field of Classification Search
  CPC ........ H05K 1/03; H05K 1/036; H05K 1/0306; B32B 2457/08
  See application file for complete search history.

(56) References Cited

U.S. PATENT DOCUMENTS

| | | | |
|---|---|---|---|
| 7,273,900 B2 | 9/2007 | Amou et al. | |
| 8,420,210 B2 | 4/2013 | Amou et al. | |
| 10,316,187 B2 * | 6/2019 | Chikara | ................... B32B 27/20 |
| 10,660,213 B2 * | 5/2020 | Uchida | .................... B32B 15/08 |
| 10,887,984 B2 * | 1/2021 | Uchida | ............... C08K 5/34924 |
| 2008/0261472 A1 | 10/2008 | Amou et al. | |
| 2011/0088933 A1 | 4/2011 | Amou et al. | |
| 2015/0044484 A1 | 2/2015 | Ito et al. | |
| 2016/0130406 A1 * | 5/2016 | Hsieh | ......................... B32B 5/02 |
| | | | 428/141 |
| 2017/0223843 A1 | 8/2017 | Kawakami et al. | |
| 2017/0342264 A1 * | 11/2017 | Jung | ...................... H05K 3/022 |
| 2017/0354033 A1 | 12/2017 | Uchida et al. | |

FOREIGN PATENT DOCUMENTS

| | | |
|---|---|---|
| CN | 104774476 A | 7/2015 |
| JP | 07-142830 A | 6/1995 |
| JP | 2003-138127 A | 5/2003 |
| JP | 2005-008829 A | 1/2005 |
| JP | 2008-266408 A | 11/2008 |
| JP | 4325337 B2 | 9/2009 |
| JP | 2011-091066 A | 5/2011 |
| JP | 2017-082200 A | 5/2017 |
| TW | 201540140 A | 10/2015 |
| TW | 201634581 A | 10/2016 |
| WO | 2013/141298 A1 | 9/2013 |
| WO | 2016/141707 A1 | 9/2016 |
| WO | 2018/186025 A1 | 10/2018 |

\* cited by examiner

*Primary Examiner* — Elizabeth E Mulvaney
(74) *Attorney, Agent, or Firm* — Volpe Koenig

(57) ABSTRACT

Provided are: a prepreg with low dielectric constant, low dielectric loss tangent, and improved adhesiveness to glass cloth; and a laminate for a circuit board. The prepreg is formed of the glass cloth serving as a base material and a semi-cured product of a thermosetting resin composition impregnated into the glass cloth, where the glass cloth comprises a treated surface treated by at least one type of silane coupling agent selected from methacryl-based silane coupling agents, acryl-based silane coupling agents, and isocyanate-based silane coupling agents, and the thermosetting resin composition contains polyphenyleneether having a terminal hydroxyl group modified with an ethylenically unsaturated compound in a main chain of the polyphenyleneether. The laminate for the circuit board is obtained by laminating the prepreg and a conductor layer.

9 Claims, No Drawings

PREPREG AND LAMINATE FOR CIRCUIT BOARD

CROSS REFERENCE TO RELATED APPLICATION

This application is a continuation of prior International Application No. PCT/JP2018/046589, filed on Dec. 18, 2018 which is based upon and claims the benefit of priority from Japanese Patent Application No. 2018-032996, filed on Feb. 27, 2018; the entire contents of all of which are incorporated herein by reference.

FIELD

Embodiments described herein relate generally to a prepreg and a laminate for a circuit board, and particularly to a prepreg capable of creating a circuit board having a low dielectric constant and a low dielectric loss tangent, and a laminate for a circuit board using the prepreg.

BACKGROUND

In recent years, as speed and integration of LSIs have increased, memory capacity has increased, and so on, a size, weight, thickness, and the like of various electronic components have been rapidly reduced. For this reason, better heat resistance, dimensional stability, electric properties, and so on are required in terms of materials.

Conventionally, thermosetting resins such as a phenol resin, an epoxy resin, and a polyimide resin are used for a printed wiring board. Although these resins have a good balance of various performances, they have insufficient dielectric properties in a high-frequency range.

Polyphenyleneether is attracting attention as a new material for solving this problem, and its application to a copper-clad laminate is being attempted (for example, refer to JP-A-2005-8829). In recent years, it is also known that a silane coupling agent adsorption layer is formed on a glass cloth surface in response to a fine pitch of circuits (for example, refer to Japanese Patent No. 4325337, JP-A-Hei7-142830).

SUMMARY

In recent years, further reduction of the dielectric constant and dielectric loss tangent at a higher frequency range has been required. For this reason, further reduction of the dielectric constant and dielectric loss tangent in such a high-frequency range is required for polyphenyleneether as well. However, since polyphenyleneether has few functional groups with high polarity that contribute to adhesion, there is a tendency that adhesive properties between the glass cloth and a resin-cured layer decrease, and there is a growing demand for a low dielectric substrate with higher adhesive strength.

An object of the present disclosure is to provide a prepreg having a low dielectric constant and low dielectric loss tangent with improved adhesiveness to glass cloth. Further, another object of the present disclosure is to provide a laminate for a circuit board using such a prepreg.

A prepreg according to the present disclosure is a prepreg formed of glass cloth as a base material and a semi-cured product of a thermosetting resin composition impregnated into the glass cloth. The glass cloth comprises a treated surface, which is treated by at least one type of silane coupling agent selected from methacryl-based silane coupling agents, acryl-based silane coupling agents, and isocyanate-based silane coupling agents, and the thermosetting resin composition contains polyphenyleneether having a terminal hydroxyl group modified with an ethylenically unsaturated compound in a main chain of the polyphenyleneether.

A laminate for a circuit board according to the present disclosure is formed by laminating the prepreg of the present disclosure and a conductor layer.

According to the prepreg and the laminate for the circuit board of the present disclosure, materials having a low dielectric constant and low dielectric loss tangent, and having excellent adhesiveness between glass cloth and a resin-cured product can be obtained, and a high-frequency wiring board can be easily manufactured by using the materials.

DETAILED DESCRIPTION

Hereinafter, a prepreg and a laminate for a circuit board of the present disclosure are explained with reference to one embodiment.

[Prepreg]

A prepreg in this embodiment is formed by glass cloth serving as a base material and a semi-cured product of a thermosetting resin composition, which is impregnated into the glass cloth, the glass cloth used here has a treated surface, which is treated with any of methacryl-based silane coupling agents, acryl-based silane coupling agents, or isocyanate-based silane coupling agents, and the thermosetting resin composition contains polyphenyleneether having a terminal hydroxyl group modified with an ethylenically unsaturated compound in a main chain of the polyphenyleneether.

The thermosetting resin composition used in this embodiment contains polyphenyleneether where the terminal hydroxyl group of the main chain is modified with the ethylenically unsaturated compound, and a commercially-available low dielectric constant resin composition can also be used. As such thermosetting resin compositions, for example, a resin composition containing (A) modified polyphenyleneether having a terminal hydroxyl group modified with an ethylenically unsaturated compound in a main chain of the polyphenyleneether, (B) a cyanurate compound formed of at least one type of triallyl isocyanurate and triallyl cyanurate, and (C) an organic peroxide is preferably used. Each of the components of (A) to (C) is explained in detail below.

An example of the (A) polyphenyleneether where the terminal hydroxyl group of the main chain is modified with the ethylenically unsaturated compound includes, for example, polyphenyleneether represented by the following general formula (I)

[Chemical formula 1]

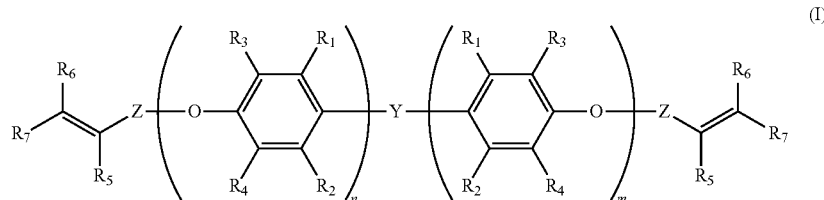

(In the general formula (I), $R_1$ to $R_7$ are independently a hydrogen atom, a straight-chain or branched-chain alkyl group having a carbon number of 1 to 8, a straight-chain or branched-chain alkenyl group having a carbon number of 2 to 8, a straight-chain or branched-chain alkynyl group having a carbon number of 2 to 8, or an aryl group having a carbon number of 6 to 10, Y is an oxygen atom, a methylene group, or a dimethylmethylene group, Z is a carbonyl group, a thiocarbonyl group, a methylene group, an ethylene group, a trimethylene group, or a tetramethylene group, n is an integer of 1 to 100, m is an integer of 1 to 100, and n +m is an integer of 2 to 200.)

$R_1$ to $R_7$ are preferably each independently the hydrogen atom, a methyl group, an ethyl group, or a phenyl group.

The organic groups containing the carbon atoms of $R_1$ to $R_7$ in the above general formula (I), such as, for example, the alkyl group, the alkenyl group, the alkynyl group, and the aryl group may further have a substituent, and examples of the substituent include, for example, a carboxyl group, an aldehyde group, a hydroxyl group, and an amino group.

The content of the (A) modified polyphenyleneether is preferably 29.9 to 90 mass % when the total amount of the (A) modified polyphenyleneether, the (B) cyanurate compound, and the (C) organic peroxide is set to 100 mass %. By setting this content range, the dielectric constant and dielectric loss tangent can further be reduced. The content of the (A) modified polyphenyleneether is more preferably 40 to 75 mass %.

The (B) cyanurate compound used in this embodiment is formed by containing one type selected from triallyl isocyanurate and triallyl cyanurate, which acts as a crosslinking agent to crosslink with the (A) modified polyphenyleneether. As the (B) cyanurate compound, triallyl isocyanurate and triallyl cyanurate may be respectively used independently or in combination. A cured product having excellent dielectric properties and heat resistance can be obtained by using the cyanurate compound. Among them, triallyl isocyanurate is preferably used.

A commercial product can be used as the (B) cyanurate compound. For example, commercial products of triallyl isocyanurate include TAICROS (produced by Evonik Degussa GmbH, product name; the content of diaryl isocyanurate: 100 to 400 ppm), and so on. Further, diallyl isocyanurate contained in triallyl isocyanurate as an impurity is preferably 500 ppm or less in terms of suppressing decrease of the heat resistance. This is true for the triallyl cyanurate as well.

The content of the (B) cyanurate compound is preferably 9.9 to 70 mass % when the total amount of the (A) modified polyphenyleneether, the (B) cyanurate compound, and the (C) organic peroxide is set to 100 mass %. By setting this content range, a cured product having high heat resistance can be obtained. The content of the (B) cyanurate compound is more preferably 20 to 50 mass %.

The (C) organic peroxide used in this embodiment is a compound that acts as a radical initiator. The (C) organic peroxide is a compound that generates a radical under a mild condition and promotes a polymerization reaction for polymerizing the (A) modified polyphenyleneether and the (B) cyanurate compound through a radical reaction and obtaining a polymer (crosslinked product) of these.

The (C) organic peroxide only needs to be organic peroxide functioning as a well-known radical initiator and is not particularly limited. Examples of such organic peroxide include, for example, di-t-butyl peroxide, 2,5-dimethyl-2,5-di(t-butyl peroxide)hexane, 2,5-dimethyl-2,5-di(t-butyl peroxide)hexyne-3, t-butyl cumyl peroxide, α,α'-di-(t-butylperoxy)diisopropylbenzene, t-butylperoxybenzoate, and so on.

As the (C) organic peroxide, a commercial product can be used. Examples of such a product include, for example, "PERBUTYL D", "PERHEXA 25B", "PERHEXYNE 25B", "PERBUTYL C", "PERBUTYL P", and "PERBUTYL Z", (which are each produced by NOF CORPORATION), and so on.

The (C) organic peroxide preferably does not have a benzene ring in a structure thereof. Not having the benzene ring makes it possible to reduce the dielectric loss tangent more efficiently.

The content of the (C) organic peroxide is preferably 0.1 to 7 mass % when the total content of the (A) modified polyphenyleneether, the (B) cyanurate compound, and the (C) organic peroxide is set to 100 mass %. By setting this content range, it becomes possible to obtain a cured product having high heat resistance. Further, the content of the (C) organic peroxide is more preferably 0.5 to 5 mass %.

As the resin composition in this embodiment, each of the components of (A) to (C) is preferably compounded, but it is further preferable to contain a (D) butadiene-styrene copolymer, which is explained next.

The (D) butadiene-styrene copolymer used in this embodiment is a copolymer obtained by polymerizing butadiene and styrene and is a component that reacts with the (A) modified polyphenyleneether and the (B) cyanurate compound to form a polymer (crosslinked product). Concretely, a double bond present in the (D) butadiene-styrene copolymer and double bonds present in the (A) modified polyphenyleneether and the (B) cyanurate compound react and polymerize.

The (D) butadiene-styrene copolymer is preferably made by polymerizing butadiene and styrene in a mass ratio of 50/50 to 90/10 (butadiene/styrene). When the mass ratio is 50/50 to 90/10, adhesiveness to a copper foil can be increased. This mass ratio is more preferably 50/50 to 80/20, and further preferably 50/50 to 70/30 in terms of the dielectric loss tangent or the like.

A mass average molecular weight and a number average molecular weight of the (D) butadiene-styrene copolymer are not particularly limited, and an oligomer having a relatively low polymerization degree (a small molecular weight) can also be used. The (D) butadiene-styrene copolymer having a mass average molecular weight of about 1,000 to 100,000 can be used normally.

The content of the (D) butadiene-styrene copolymer is preferably 0.5 to 20 mass % when the total content of the (A) modified polyphenyleneether, the (B) cyanurate compound, the (C) organic peroxide, and the (D) butadiene-styrene copolymer is set to 100 mass %. By setting this content range, it becomes possible to reduce the dielectric constant and dielectric loss tangent and increase the adhesiveness to a metal foil. The content of the (D) butadiene-styrene copolymer is more preferably 3 to 15 mass %.

The resin composition used in this embodiment may further contain a solvent as necessary within a range not departing from the scope of the present disclosure. Here, the solvent is used as a solvent for dissolving or dispersing each component of (A) to (D) and examples of the solvent include, for example, toluene, and so on.

This solvent is preferably 70 to 140 parts by mass, and more preferably 80 to 130 parts by mass when the total content of the (A) modified polyphenyleneether, the (B) cyanurate compound, the (C) organic peroxide, and the (D) butadiene-styrene copolymer is set to 100 parts by mass.

The resin composition used in this embodiment can also further contain a filler, a flame retardant, a stress-reducing agent, and so on as necessary within a range not departing from the scope of the present disclosure Examples of the filler include, for example, silicas such as pulverized silica and fused silica, carbon black, titanium oxide, barium titanate, glass beads, glass hollow balls, and so on, and these may be used alone or in a combination of two or more types. As the filler, a commercial product can be used, and examples of the silica include, for example, fused silica treated with methacrylic silane: SFP-130MHM (produced by Denka Company Ltd., product name), FUSELEX E-2, Adma Fine SO-C5, and PLV-3 (each produced by TATSUMORI LTD., product name), and so on.

The average particle size of the filler is preferably 10 μm or less. When it is 10 μm or less, the adhesiveness to the metal foil can further be increased.

When the filler is compounded, the content ratio is preferably 5 to 40 parts by mass when the total content of the (A) modified polyphenyleneether, the (B) cyanurate compound, the (C) organic peroxide, and the (D) butadiene-styrene copolymer is set to 100 parts by mass. By setting this content range, melt flowability of the resin composition improves, the adhesiveness to the metal foil increases, and connection reliability of through-hole conductors also increases. The filler is more preferably 10 parts by mass or more, further preferably 15 parts by mass or more, and particularly preferably 20 parts by mass or more. The filler is more preferably 35 parts by mass or less.

Examples of the flame retardant include melamine phosphate, melam polyphosphate, melem polyphosphate, melamine pyrophosphate, ammonium polyphosphate, red phosphorus, aromatic phosphate ester, phosphonate ester, phosphinic ester, phosphine oxide, phosphazene, melamine cyanurate, and so on. These flame retardants may be used alone or in a combination of two or more types. Melamine pyrophosphate, melamine polyphosphate, melam polyphosphate, and ammonium polyphosphate are preferred out of the above in terms of dielectric properties, flame resistance, heat resistance, adhesiveness, moisture resistance, chemical resistance, reliability, and so on.

When the flame retardant is compounded, the content ratio is preferably 15 to 45 parts by mass when the total content of the (A) modified polyphenyleneether, the (B) cyanurate compound, the (C) organic peroxide, and the (D) butadiene-styrene copolymer is set to 100 parts by mass. By setting this content range, it becomes possible to further improve the flame resistance and the heat resistance with little or no influence on the dielectric properties, the adhesiveness, and the moisture resistance of the cured product.

Examples of the stress-reducing agent include silicone resin particles not having a core-shell structure, and so on. Examples of such silicone resin particles include, for example, X-52-875 and X-52-854 (produced by Shin-Etsu Chemical Co., Ltd., product name), MSP-1500 (produced by Nikko Rica Corporation, product name), MSP-3000 (produced by Nikko Rica Corporation, product name), and so on. These stress-reducing agents may be used alone or in a combination of two or more types.

The average particle size of the stress-reducing agent is preferably 10 μm or less. When it is 10 μm or less, the adhesiveness to the metal foil can further be increased. Incidentally, the average particle size in this specification is a 50% integrated value (50% particle size) found from a particle size distribution curve obtained by measuring a volume-based particle size distribution by using a laser diffraction/scattering method.

When the stress-reducing agent is compounded, the content ratio is preferably 1 to 10 parts by mass when the total content of the (A) modified polyphenyleneether, the (B) cyanurate compound, the (C) organic peroxide, and the (D) butadiene-styrene copolymer is set to 100 parts by mass. By setting this content range, it becomes possible to further increase the adhesiveness of a cured product to the copper foil and the moisture resistance, and also increase the connection reliability of through-hole conductors.

The resin composition used in this embodiment can further contain an additive, and so on. Examples of this additive include, for example, an antioxidant, a heat stabilizer, an antistatic agent, a plasticizer, a pigment, a dye, a coloring agent, and so on. Concrete examples of the additive include, for example, R-42 (produced by Sakai Chemical Industry Co., Ltd.), IRGANOX 1010 (produced by BASF), and so on. The fillers and the additives may be used alone or in a combination of two or more types.

Further, the resin composition used in this embodiment can further contain at least one type of other thermoplastic resins and thermosetting resins. Examples of the thermoplastic resin include, for example, GPPS (general purpose polystyrene), HIPS (high impact polystyrene), and so on. Examples of the thermosetting resin include, for example, an epoxy resin, and so on. These resins may be used alone or in a combination of two or more types.

The resin composition used in this embodiment is obtained by mixing the components of (A) to (C), which are essential components, and the (D) component and the other components to be added as necessary, for example. As a mixing method, there are cited a solution mixing method of uniformly dissolving or dispersing all the components in a solvent, a melt-blending method that is carried out using an extruder or the like while heating, and so on.

[Glass Cloth]

The glass cloth used in this embodiment is a glass cloth base material whose surface is treated by at least one type of silane coupling agent selected from methacryl-based silane coupling agents, acryl-based silane coupling agents, and isocyanate-based silane coupling agents.

There is no limitation on the material of the glass cloth used here, as long as it is a well-known material, and examples of the glass cloth include D glass, S glass, quartz glass, and so on in addition to ordinary E glass. A weaving method is also not particularly limited, and any well-known weaving method, for example, such as plain weave, twill weave, and thirl plain weave, can be arbitrary selected. Among them, plain-weave glass cloth is preferable because surface smoothness is easily obtained.

The thickness of the glass cloth and the ratio of the glass cloth thickness to the overall thickness of the laminate are also not particularly limited, and may be the same as those of well-known glass cloth. The thickness of the glass cloth is, for example, preferably 10 to 200 μm.

The glass cloth preferably has air permeability in a range of 20 to 220 $cm^3/cm^2/s$. When the glass cloth in this embodiment has the air permeability of 220 $cm^3/cm^2/s$ or less, occurrence of pinholes can be suppressed when the glass cloth is used as a prepreg. The air permeability of the glass cloth in this embodiment becomes 20 $cm^3/cm^2/s$ or more according to the normal technology.

The glass cloth in this embodiment is surface treated with a specific coupling agent as described above, but the surface treatment of the glass cloth with the coupling agent can be performed by a well-known method and is not particularly limited. For example, a method such as a sizing treatment in which an organic solvent solution or suspension where the above-mentioned coupling agent is dissolved is applied to the glass cloth as what is called a sizing agent can be exemplified.

Here, the treatment amount of the silane coupling agent is preferably in a range of 0.01 to 1.50 mass % when the glass cloth is set to 100 mass %. By setting this range, good delamination strength, moisture absorption and heat resistance, reflow resistance, and insulation reliability can be secured.

Here, an evaluation method of the treatment amount of the silane coupling agent was calculated from a value obtained by incinerating the glass cloth after surface treatment at 630° C. for 30 minutes under an air atmosphere and dividing the difference in mass before and after incineration by the mass before incineration and multiplying by 100.

The thickness of the glass cloth is measured by a micrometer based on JIS R 3420, the mass of the glass cloth is measured by a scale based on JIS R 3420, and the air permeability of the glass cloth is measured by a fragile type air permeability tester based on JIS R 3420.

As the silane coupling agent used for the surface treatment of the glass cloth, a commercially available epoxy-based or amino-based silane coupling agent has been used for a long time because it is effective for an epoxy-based base material, but regarding the recent response to the higher frequency, the case where the epoxy-based or amino-based silane coupling agent fails to satisfy required properties such as the delamination strength and the heat resistance is on the increase.

In this embodiment, after keenly investigating a configuration that enables the improvement of properties in the use of the resin composition formed mainly of polyphenyleneether, it was found that the use of a silane coupling agent containing at least any one type of the methacryl-based silane coupling agents, the acryl-based silane coupling agents, and the isocyanate-based silane coupling agent as the surface treatment agent improves the delamination strength and the heat resistance and provides an excellent prepreg. Among the above, the acryl-based silane coupling agents or the isocyanate-based silane coupling agents are more preferable as the silane coupling agent in terms of improving the moisture absorption and heat resistance.

Examples of the methacryl-based silane coupling agents include, for example, 3-methacryloxypropylmethyldimethoxysilane (product name: KBM-502, produced by Shin-Etsu Chemical Co., Ltd.), 3-methacryloxypropyltrimethoxysilane (product name: KBM-503, produced by Shin-Etsu Chemical Co., Ltd.), 3-methacryloxypropylmethyldimethoxysilane (product name: KBE-502, produced by Shin-Etsu Chemical Co., Ltd.), 3-methacryloxypropyltriethoxysilane (product name: KBE-503, produced by Shin-Etsu Chemical Co., Ltd.), and so on.

Examples of the acryl-based silane coupling agents include, for example, 3-acryloxypropylmethyldimethoxysilane (product name: KBM-5102, produced by Shin-Etsu Chemical Co., Ltd.), 3-acryloxypropyltrimethoxysilane (product name: KBM-5103, produced by Shin-Etsu Chemical Co., Ltd.), and so on.

Examples of the isocyanate-based silane coupling agents include, for example, tris-(trimethoxysilyl propyl)isocyanurate (product name: KBM-9659, produced by Shin-Etsu Chemical Co., Ltd.), 3-triisocyanatepropyltriethoxysilane (product name: A-1310, produced by Momentive Performance Materials Inc.), 3-isocyanatepropyltrimethoxysilane (product name: Y-5187, produced by Momentive Performance Materials Inc.), and so on.

The prepreg in this embodiment can be obtained by applying or impregnating the resin composition to/into a base material on the glass cloth with the surface treated by the predetermined silane coupling agent in accordance with an ordinary method, and then semi-curing the resin composition by drying.

The method of manufacturing the prepreg according to this embodiment is not particularly limited, and well-known methods can be used. For example, a method can be cited in which the resin composition according to this embodiment is uniformly dissolved or dispersed in a solvent (for example, an aromatic solvent, a ketone-based solvent such as acetone, or the like) as necessary and the solvent is applied to or impregnated into the base material to then be dried. Alternatively, the resin composition may be melted and the base may be impregnated with the melted resin composition.

The application method and the impregnating method are not particularly limited, and for example, a method of applying a dissolution liquid or dispersion liquid of the resin composition using a spray, a brush, a bar coater, or the like, a method of dipping the base material in a dissolution liquid or dispersion liquid of the resin composition (dipping), and so on can be cited. It is possible to repeat the application or the impregnation a plurality of times as necessary. Alternatively, it is also possible to repeat the application or the impregnation by using a plurality of dissolution liquids or dispersion liquids with different resin concentrations.

[Laminate for Circuit Board]

The laminate for the circuit board in this embodiment is a metal foil-clad laminate obtained by adhering a metal foil to a surface of the prepreg in this embodiment. The metal foil-clad laminate can be manufactured by overlaying a metal foil such as a copper foil on the prepreg to be formed while applying heat and pressure.

The metal-clad laminate can be obtained by, for example, overlaying a plurality of prepregs in this embodiment and metal foils with one another according to the desired thickness, and forming while applying heat and pressure. Further, a thicker multilayer board can be obtained by combining the obtained laminate with another prepreg.

The laminate for the circuit board in this embodiment includes a plurality of insulating layers and conductor layers disposed between these insulating layers, and the insulating layer is formed with the prepreg. That is, the laminate for the circuit board is the same as a well-known laminate for a circuit board except that the prepreg in this embodiment is used.

The circuit board in this embodiment can be manufactured by overlaying the copper foil on the prepreg and forming while applying heat and pressure. The copper-clad laminate is obtained by, for example, overlaying a plurality of prepregs in this embodiment and copper foils with one another according to the desired thickness, and forming while applying heat and pressure. Further, a thicker multi-layer board can be obtained by combining the obtained laminate with another prepreg.

In the forming while applying heat and pressure, forming and curing are performed simultaneously by using a heat press machine, for example. The forming while applying heat and pressure is preferably performed at 80 to 300° C. for one minute to 10 hours under a pressure of 0.1 to 50 MPa and more preferably performed at 150 to 250° C. for 60 minutes to five hours under a pressure of 0.5 to 6 MPa. Incidentally, the forming and the curing may be performed separately. For example, a laminate in a semi-cured state may be formed to then be cured completely by treatment with a heat treatment machine.

The circuit board in this embodiment has a plurality of insulating layers and conductor layers each disposed between these insulating layers, and each insulating layer is formed with the prepreg. That is, the circuit board has the same configuration as a well-known circuit board except that the prepreg in this embodiment is used.

The circuit board as stated above can be manufactured as, for example, described below.

First, on the above-described metal-clad laminate, circuits and through-hole conductors are formed to manufacture an inner layer board. After that, the prepreg and a conductive metal foil are laminated in this order on a surface of this inner layer board to be formed while applying heat and pressure. The circuit board where conductor layers are disposed between the plurality of insulating layers can be thereby obtained. Further, a multilayer printed wiring substrate may be made by forming circuits and through-holes on the conductive metal foil provided on the surface of this circuit board.

EXAMPLES

Hereinafter, the embodiment of the present disclosure will be explained concretely with reference to examples. Note that, this embodiment is not limited to these examples.

Components, which are used to prepare the resin compositions in examples and comparative examples, are described below.
<Resin Composition>
[(A) Polyphenyleneether]
(A1): Methacryl-modified polyphenyleneether SA9000 (produced by SABIC, product name, number average molecular weight Mn: 2,000 to 3,000, in the general formula (I), $R_3$, $R_4$, and $R_5$ represent a methyl group, $R_1$, $R_2$, $R_6$, and $R_7$ represent a hydrogen atom, Y represents a bisphenol-A residue, and Z represents a carbonyl group, where m is 1 to 80, and n is 1 to 80)
(A2): Methacryl-modified polyphenyleneether SA6000 (produced by SABIC, product name, number average molecular weight Mn: 3,000 to 5,000, in the general formula (I), $R_3$, $R_4$, and $R_5$ represent a methyl group, $R_1$, $R_2$, $R_6$, and $R_7$ represent a hydrogen atom, Y represents a bisphenol-A residue, and Z represents a carbonyl group, where m is 1 to 90, and n is 1 to 90)
(A3): Polyphenyleneether SA90 (produced by SABIC, product name, number average molecular weight Mn: 2,000 to 3,000)
[(B) Cyanurate Compound]
(B1): Triallyl isocyanurate: TAICROS (produced by Evonik Co., Ltd., product name, the content of diallyl isocyanurate 300 ppm)
[(C) Organic Peroxide]
(C1): α,α'-di-(t-butylperoxy)diisopropylbenzene: PERBUTYL P (produced by NOF CORPORATION, product name)
[(D) Butadiene-Styrene Copolymer]
(D1): Butadiene-styrene copolymer RICON184 (produced by CRAY VALLEY, product name, mass ratio (butadiene/styrene)=72/28)
[Others]
(Silica): SFP-130MC (produced by Denka Company Ltd., product name, average particle size 0.5 μm)

EXAMPLES 1 TO 7, COMPARATIVE EXAMPLES 1 TO 4

The (A) polyphenyleneether, the (B) cyanurate compound, the (C) organic peroxide, the (D) butadiene-styrene copolymer, and silica were mixed in the proportions shown in Tables 1 and 2, and these were stirred at room temperature (25° C.) to obtain thermosetting resin compositions.

Next, silane coupling agents listed below were each dissolved in water to obtain an aqueous solution of 2.0 g/L. This aqueous solution was uniformly coated on 100 μm plain-weave glass cloth (produced by Nitto Boseki Co., Ltd. 2116 type) by a dipping method. The silane coupling agents used here are listed below. A treatment amount of each silane coupling agent of the glass cloth obtained here was calculated from a value obtained by incinerating the surface-treated glass cloth at 630° C. for 30 minutes under the air atmosphere and dividing the difference in mass before and after incineration by the mass before incineration and multiplying by 100, and results are listed in Tables 1-2.
[Silane Coupling Agent]
(Methacryl-base 1): 3-methacryloxypropylmethyldimethoxysilane (product name: KBM-502, produced by Shin-Etsu Chemical Co., Ltd.)
(Methacryl-base 2): 3-methacryloxypropyltrimethoxysilane (product name: KBM-503, produced by Shin-Etsu Chemical Co., Ltd.)
(Methacryl-base 3): 3-methacryloxypropylmethyldiethoxysilane (product name: KBE-502, produced by Shin-Etsu Chemical Co., Ltd.)
(Methacryl-base 4): 3-methacryloxypropyltriethoxysilane (product name: KBE-503, produced by Shin-Etsu Chemical Co., Ltd.)
(Acryl-base): 3-acryloxypropyltrimethoxysilane (product name: KBM-5103, produced by Shin-Etsu Chemical Co., Ltd.)
(Isocyanurate-base): tris-(trimethoxysilyl propyl)isocyanurate (product name: KBM-9659, produced by Shin-Etsu Chemical Co., Ltd.)
(Epoxy-base): 2-(3,4-epoxycyclohexyl)ethyltrimethoxysilane (product name: KBM-303, produced by Shin-Etsu Chemical Co., Ltd.)

(Amine-base): N-phenyl-3-aminopropyltrimethoxysilane (product name: KBM-573, produced by Shin-Etsu Chemical Co., Ltd.)

(Vinyl-base): vinyltrimethoxysilane (product name: KBM-1003, produced by Shin-Etsu Chemical Co., Ltd.)

Next, the obtained thermosetting resin compositions were each dissolved in toluene to obtain a resin varnish. The glass cloth with a thickness of 100 μm was immersed in this resin varnish and the glass cloth was impregnated with the resin varnish. Thereafter, the glass cloth impregnated with the resin varnish was dried for seven minutes at 130° C. to obtain a prepreg with a thickness of 135 μm. The ratio of the base material to the prepreg is 60 mass %.

Six pieces of the prepregs were overlaid on one another to manufacture a laminate. Further, a copper foil with a thickness of 18 μm was laminated on each of both surfaces of this laminate. Thereafter, the laminate was heated at 195° C. for 75 minutes under a pressure of 4 MPa to cure the resin in the prepreg, to thereby obtain a copper-clad laminate with a thickness of 0.8 mm.

[Test Examples]

Next, the copper-clad laminates obtained in Examples 1 to 7 and Comparative examples 1 to 4 and wiring boards using these copper-clad laminates were evaluated for the following properties. Results are listed together in Tables 1, 2.

(Delamination Strength)

The delamination strength (kN/m) of each copper-clad laminate was measured by removing the cured prepreg from the outermost layer using a cutter and then performing a 90-degree peel test. In the 90-degree peel test, a sample where one end of the cured prepreg was peeled off from the copper-clad laminate for about 10 mm was attached to a support metal fitting, and the sample was peeled off 25 mm or more in a direction perpendicular to a surface of the sample at a speed of 50 mm/min, grasping a tip of the prepreg peeled off as described above.

(Moisture Absorption and Solder Heat Resistance)

After treating the laminate whose copper foil is etched for eight hours by PCT (121° C., 2 atm), the copper-clad laminate was immersed in solder at 300° C., or 320° C. for three minutes to observe delamination to thereby evaluate the heat resistance. Four pieces of the laminates were observed, and it was evaluated as "good" when all of the four pieces did not swell at 320° C., it was evaluated as "acceptable" when all of the four pieces did not swell at 300° C., and it was evaluated as "not acceptable" when even one piece swelled at 300° C.

(Dielectric Constant, Dielectric Loss Tangent)

After drying the laminate whose copper foil was etched at 110° C. for two hours, a measurement was carried out by using a disc-shaped cavity resonator at 10 GHz.

(Reflow Resistance)

After forming through-holes in each obtained copper-clad laminate, circuits (wiring layers) and through-hole conductors were formed to obtain an inner layer board. This inner layer board and the prepreg obtained in each example were overlaid on each other to be heated at 190° C. and pressurized at 4 MPa, to obtain a 3.0 mm-wiring board. The reflow resistance was tested by a pretreatment: 85° C./85%/168 h, under a reflow condition: Pb free reflow (260° C.), and the occurrence of delamination was confirmed by a scanning electron microscope.

It was evaluated as "good" when delamination did not occur after 20 times of reflowing, evaluated as "acceptable" when delamination did not occur after 10 times of reflowing, and evaluated as "not acceptable" when delamination partially occurred. Results are listed in Tables.

(Insulation Reliability)

After forming through-holes in each obtained copper-clad laminate, circuits (wiring layers) and through-hole conductors were formed to obtain an inner layer board. This inner layer board and the prepreg were overlaid on each other to be heated at 190° C. and pressurized at 4 MPa to obtain a 3.0 mm-wiring board. An insulation property between the through-holes was tested by a pretreatment: 10 cycles of Pb free reflow, under a condition: 65° C./85%/50 VDC, and the time (h) when the insulation resistance of $10^8$ Ω or more was maintained was measured.

(Transmission Loss)

After forming through-holes in each obtained copper-clad laminate, circuits (wiring layers) and through-hole conductors were formed to obtain an inner layer board. This inner layer board and the prepreg were overlaid on each other to be heated at 190° C. and pressurized at 4 MPa to obtain a 3.0 mm-wiring board. After that, the transmission loss (dB/m) at 10 GHz was measured by using a vector network analyzer.

TABLE 1

| | | | Example | | | | | | |
|---|---|---|---|---|---|---|---|---|---|
| | | | 1 | 2 | 3 | 4 | 5 | 6 | 7 |
| Resin | (A) | (A1) | 50 | 50 | 50 | 50 | 50 | 50 | — |
| composition | | (A2) | — | — | — | — | — | — | 50 |
| (Parts | | (A3) | — | — | — | — | — | — | — |
| by mass) | (B) | (B1) | 35 | 35 | 35 | 35 | 35 | 35 | 35 |
| | (C) | (C1) | 5 | 5 | 5 | 5 | 5 | 5 | 5 |
| | (D) | (D1) | 10 | 10 | 10 | 10 | 10 | 10 | 10 |
| | | (Silica) | 30 | 30 | 30 | 30 | 30 | 30 | 30 |
| Glass cloth | | | Plain weave E-glass cloth | | | | | | |
| Surface treatment agent | | | Methacryl-base 1 | Methacryl-base 2 | Methacryl-base 3 | Methacryl-base 4 | Acryl-base | Isocyanate-base | Isocyanate-base |
| Treatment amount of surface treatment agent (%) | | | 0.7 | 0.7 | 0.7 | 0.7 | 0.7 | 0.7 | 0.7 |

TABLE 1-continued

| | | Example | | | | | | |
|---|---|---|---|---|---|---|---|---|
| | | 1 | 2 | 3 | 4 | 5 | 6 | 7 |
| Properties | Delamination strength (kN/m) | 0.51 | 0.52 | 0.53 | 0.54 | 0.67 | 0.79 | 0.71 |
| | Moisture absorption and heat resistance | Acceptable | Acceptable | Acceptable | Acceptable | Good | Good | Good |
| | Reflow resistance | Good | Good | Good | Good | Good | Good | Good |
| | Insulation reliability (h) | 500 or more | 500 or more | 500 or more | 500 or more | 500 or more | 500 or more | 500 or more |
| | Dielectric constant | 3.6 | 3.6 | 3.6 | 3.6 | 3.6 | 3.6 | 3.7 |
| | Dielectric loss tangent | 0.0035 | 0.0034 | 0.0033 | 0.0032 | 0.0028 | 0.0025 | 0.0026 |
| | Transmission loss (dB/m) | −17.5 | −17.4 | −17.3 | −17.2 | −16.9 | −16.6 | −16.7 |

TABLE 2

| | | | Comparative example | | | |
|---|---|---|---|---|---|---|
| | | | 1 | 2 | 3 | 4 |
| Resin composition (Parts by mass) | (A) | (A1) | 50 | 50 | 50 | — |
| | | (A2) | — | — | — | — |
| | | (A3) | — | — | — | 50 |
| | (B) | (B1) | 35 | 35 | 35 | 35 |
| | (C) | (C1) | 5 | 5 | 5 | 5 |
| | (D) | (D1) | 10 | 10 | 10 | 10 |
| | (Silica) | | 30 | 30 | 30 | 30 |
| Glass cloth | | | | Plain weave E-glass cloth | | |
| Surface treatment agent | | | Epoxy-base | Amine-base | Vinyl-base | Methacryl-base 3 |
| Treatment amount of surface treatment agent (%) | | | 0.7 | 0.7 | 0.7 | 0.7 |
| Properties | Delamination strength (kN/m) | | 0.23 | 0.18 | 0.43 | 0.50 |
| | Moisture absorption and heat resistance | | Not acceptable | Acceptable | Not acceptable | Acceptable |
| | Reflow resistance | | Not acceptable | Acceptable | Not acceptable | Acceptable |
| | Insulation reliability (h) | | 100 | 50 | 200 | 500 or more |
| | Dielectric constant | | 3.7 | 3.6 | 3.6 | 3.6 |
| | Dielectric loss tangent | | 0.0048 | 0.0053 | 0.0039 | 0.0089 |
| | Transmission loss (dB/m) | | −18.9 | −19.2 | −18.0 | −20.1 |

As is clear from Table 1 and Table 2, when using the prepreg where specific polyphenyleneether, cyanurate compound, and organic peroxide are contained and the glass cloth surface is surface-treated with any of methacrylic silane, acrylic silane, or isocyanurate silane, the dielectric constant and dielectric loss tangent of the laminate can be lowered and the delamination strength and moisture absorption heat resistance can be increased. Further, the reflow resistance, insulation reliability, and transmission loss of the circuit board can be improved.

What is claimed is:

1. A prepreg comprising:
   glass cloth as a base material; and
   a semi-cured product of a thermosetting resin composition impregnated into the glass cloth, wherein
   the glass cloth comprises a treated surface treated by at least one type of silane coupling agent selected from methacryl-based silane coupling agents, acryl-based silane coupling agents, and isocyanate-based silane coupling agents, and
   the thermosetting resin composition contains polyphenyleneether having a terminal hydroxyl group modified with an ethylenically unsaturated compound in a main chain of the polyphenyleneether.

2. The prepreg according to claim 1, wherein
   the thermosetting resin composition contains (A) the polyphenyleneether having a terminal hydroxyl group modified with an ethylenically unsaturated compound in the main chain of the polyphenyleneether, (B) a cyanurate compound formed of at least one type of triallyl isocyanurate and triallyl cyanurate, and (C) an organic peroxide.

3. The prepreg according to claim 1, wherein
   the polyphenyleneether contains 20 mass % or more of polyphenyleneether represented by the following general formula (I),

[Chemical formula 1]

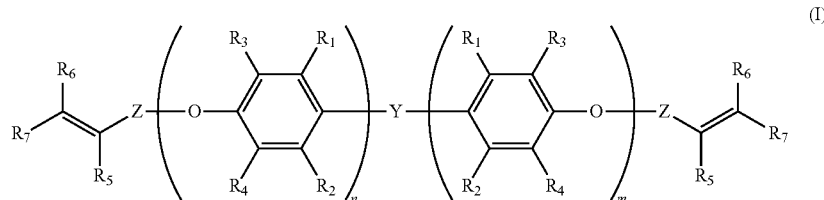

(I)

where in the general formula (I), $R_1$ to $R_7$ are independently a hydrogen atom, a straight-chain or branched-chain alkyl group having a carbon number of 1 to 8, a straight-chain or branched-chain alkenyl group having a carbon number of 2 to 8, a straight-chain or branched-chain alkynyl group having a carbon number of 2 to 8, or an aryl group having a carbon number of 6 to 10, Y is an oxygen atom, a methylene group, or a dimethylmethylene group, Z is a carbonyl group, a thiocarbonyl group, a methylene group, an ethylene group, a trimethylene group, or a tetramethylene group, n is an integer of 1 to 100, m is an integer of 1 to 100, and n+m is an integer of 2 to 200.

4. The prepreg according to claim 2, wherein
the (A) polyphenyleneether contains 20 mass % or more of polyphenyleneether represented by the following general formula (I),

[Chemical formula 1]

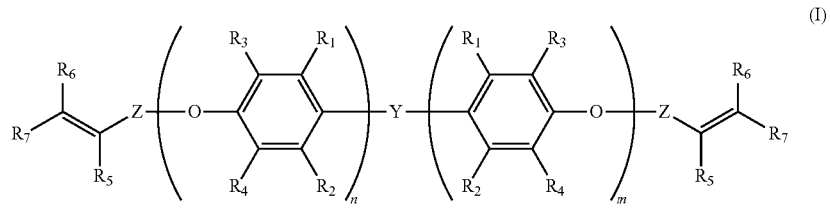

(I)

where in the general formula (I), $R_1$ to $R_7$ are independently a hydrogen atom, a straight-chain or branched-chain alkyl group having a carbon number of 1 to 8, a straight-chain or branched-chain alkenyl group having a carbon number of 2 to 8, a straight-chain or branched-chain alkynyl group having a carbon number of 2 to 8, or an aryl group having a carbon number of 6 to 10, Y is an oxygen atom, a methylene group, or a dimethylmethylene group, Z is a carbonyl group, a thiocarbonyl group, a methylene group, an ethylene group, a trimethylene group, or a tetramethylene group, n is an integer of 1 to 100, m is an integer of 1 to 100, and n+m is an integer of 2 to 200.

5. The prepreg according to claim 1, wherein
the thermosetting resin composition includes a cyanurate compound being a crosslinking agent to crosslink with the polyphenyleneether, and an organic peroxide, the organic peroxide does not include a benzene ring, and the content of the organic peroxide is 0.1 to 7 mass % when the total content of the polyphenyleneether, the cyanurate compound, and the organic peroxide is set to 100 mass %.

6. The prepreg according to claim 2, wherein
the (C) organic peroxide does not include a benzene ring, and the content of the (C) organic peroxide is 0.1 to 7 mass % when the total content of the (A) polyphenyleneether, the (B) cyanurate compound, and the (C) organic peroxide is set to 100 mass %.

7. The prepreg according to claim 2, wherein
the thermosetting resin composition further contains (D) a butadiene-styrene copolymer.

8. The prepreg according to claim 1, wherein
the glass cloth has a thickness of 10 to 200 μm, air permeability of 20 to 200 $cm^3/cm^2/s$, and a treatment amount of the silane coupling agent is 0.01 to 1.50 mass % when the glass cloth is set to 100 mass %.

9. A laminate for a circuit board, comprising:
the prepreg according to claim 1; and
a conductor layer laminated on the prepreg.

* * * * *